(12) United States Patent
Raut

(10) Patent No.: US 12,706,600 B2
(45) Date of Patent: Aug. 11, 2026

(54) ADAPTIVE GATE DRIVER WITH NEGATIVE TEMPERATURE COEFFICIENT (NTC) RESISTOR

(71) Applicant: Vertiv Corporation, Westerville, OH (US)

(72) Inventor: Dilesh Arvind Raut, Pune (IN)

(73) Assignee: Vertiv Corporation, Westerville, OH (US)

( * ) Notice: Subject to any disclaimer, the term of this patent is extended or adjusted under 35 U.S.C. 154(b) by 142 days.

(21) Appl. No.: 18/740,124

(22) Filed: Jun. 11, 2024

(65) Prior Publication Data

US 2025/0007511 A1 Jan. 2, 2025

(30) Foreign Application Priority Data

Jun. 28, 2023 (IN) ............................ 202311043329

(51) Int. Cl.
*H03K 17/14* (2006.01)

(52) U.S. Cl.
CPC .................................. *H03K 17/14* (2013.01)

(58) Field of Classification Search
CPC ...... H03K 17/14; H03K 17/145; H03K 17/04; H03K 17/041; H03K 17/08; H03K 17/0806; H03K 17/081; H03K 17/08104; H02H 7/0852
USPC ................................................ 327/108–112
See application file for complete search history.

(56) References Cited

U.S. PATENT DOCUMENTS

| | | | | |
|---|---|---|---|---|
| 7,671,662 | B2 | 3/2010 | Lui et al. | |
| 8,985,850 | B1 | 3/2015 | Godbole et al. | |
| 9,041,437 | B2 | 5/2015 | Daigo | |
| 12,081,115 | B2 * | 9/2024 | Mitsui | H03K 17/0822 |
| 12,334,917 | B2 * | 6/2025 | Zhu | H02M 1/0029 |
| 2020/0021102 | A1 | 1/2020 | Kim et al. | |

FOREIGN PATENT DOCUMENTS

| | | | |
|---|---|---|---|
| CN | 107171659 | A | 9/2017 |
| CN | 115250065 | A | 10/2022 |
| DE | 102010043109 | A1 | 5/2012 |
| KR | 20180070414 | A | 6/2018 |

OTHER PUBLICATIONS

European Patent Office, Extended European Search Report received in EP Application No. 24182741.9, Nov. 18, 2024, 11 pages.

* cited by examiner

*Primary Examiner* — Hai L Nguyen
(74) *Attorney, Agent, or Firm* — Suiter Swantz IP

(57) ABSTRACT

An adaptive gate drive circuit for an insulated gate bridge transistor, IGBT, based semiconductor switch provides a gate resistance device for reducing timing delays and switching losses associated with an increase in switch junction temperature. The gate resistance device is disposed close to the switch junction and including a negative temperature coefficient, NTC, thermistor and linear gate resistor connected in parallel. When the thermistor senses an increase in the junction temperature of the semiconductor switch, gate resistance via the linear gate resistor is reduced to bring the junction temperature back to thermal equilibrium with minimal delay, allowing the semiconductor switch to switch faster and reducing associated switching losses.

18 Claims, 8 Drawing Sheets

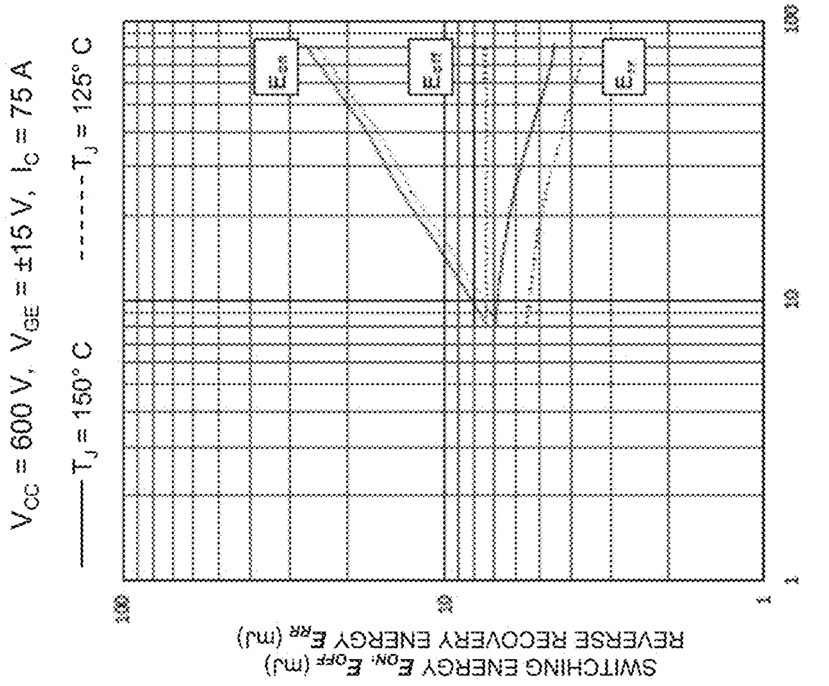
FIG. 2B
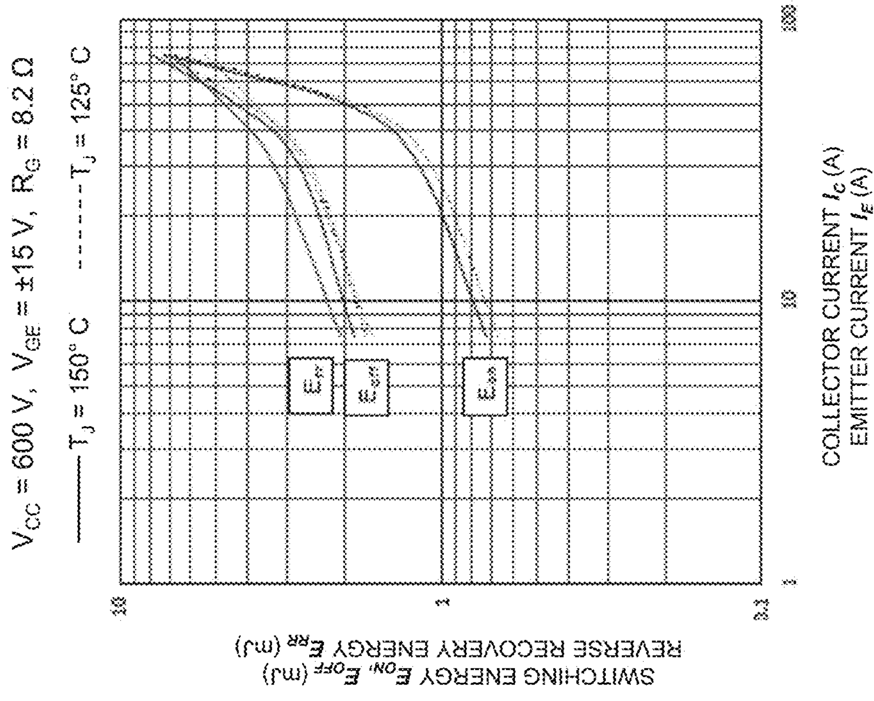
FIG. 2A

| | | | | |
|---|---|---|---|---|
| $t_{d(ON)}$ | Turn-on delay time, inductive load | $I_C$ = 50A, $V_{CE}$ = 600 V<br>$V_{GE}$ = ± 15 V<br>$R_{G(ON)}$ = 15 Ω | $T_j$ = 25° C<br>$T_j$ = 125° C<br>$T_j$ = 150° C | 0.16 μs<br>0.17 μs<br>0.17 μs |
| $t_r$ | Rise time, inductive load | $I_C$ = 50A, $V_{CE}$ = 600 V<br>$V_{GE}$ = ± 15 V<br>$R_{G(ON)}$ = 15 Ω | $T_j$ = 25° C<br>$T_j$ = 125° C<br>$T_j$ = 150° C | 0.03 μs<br>0.04 μs<br>0.04 μs |
| $t_{d(OFF)}$ | Turn-off delay time, inductive load | $I_C$ = 50A, $V_{CE}$ = 600 V<br>$V_{GE}$ = ± 15 V<br>$R_{G(ON)}$ = 15 Ω | $T_j$ = 25° C<br>$T_j$ = 125° C<br>$T_j$ = 150° C | 0.33 μs<br>0.43 μs<br>0.45 μs |
| $t_f$ | Fall time, inductive load | $I_C$ = 50A, $V_{CE}$ = 600 V<br>$V_{GE}$ = ± 15 V<br>$R_{G(ON)}$ = 15 Ω | $T_j$ = 25° C<br>$T_j$ = 125° C<br>$T_j$ = 150° C | 0.08 μs<br>0.15 μs<br>0.17 μs |
| $E_{on}$ | Turn-on energy loss, per pulse | $I_C$ = 50A, $V_{CE}$ = 600 V<br>$V_{GE}$ = ± 15 V, di/dt = 1400 A/μs<br>($T_j$ = 150° C)<br>$R_{G(ON)}$ = 15 Ω | $T_j$ = 25° C<br>$T_j$ = 125° C<br>$T_j$ = 150° C | 5.70 mJ<br>7.70 mJ<br>8.70 mJ |
| $E_{off}$ | Turn-off energy loss, per pulse | $I_C$ = 50A, $V_{CE}$ = 600 V<br>$V_{GE}$ = ± 15 V, du/dt = 3600 V/μs<br>($T_j$ = 150° C)<br>$R_{G(ON)}$ = 15 Ω | $T_j$ = 25° C<br>$T_j$ = 125° C<br>$T_j$ = 150° C | 2.80 mJ<br>4.30 mJ<br>4.80 mJ |

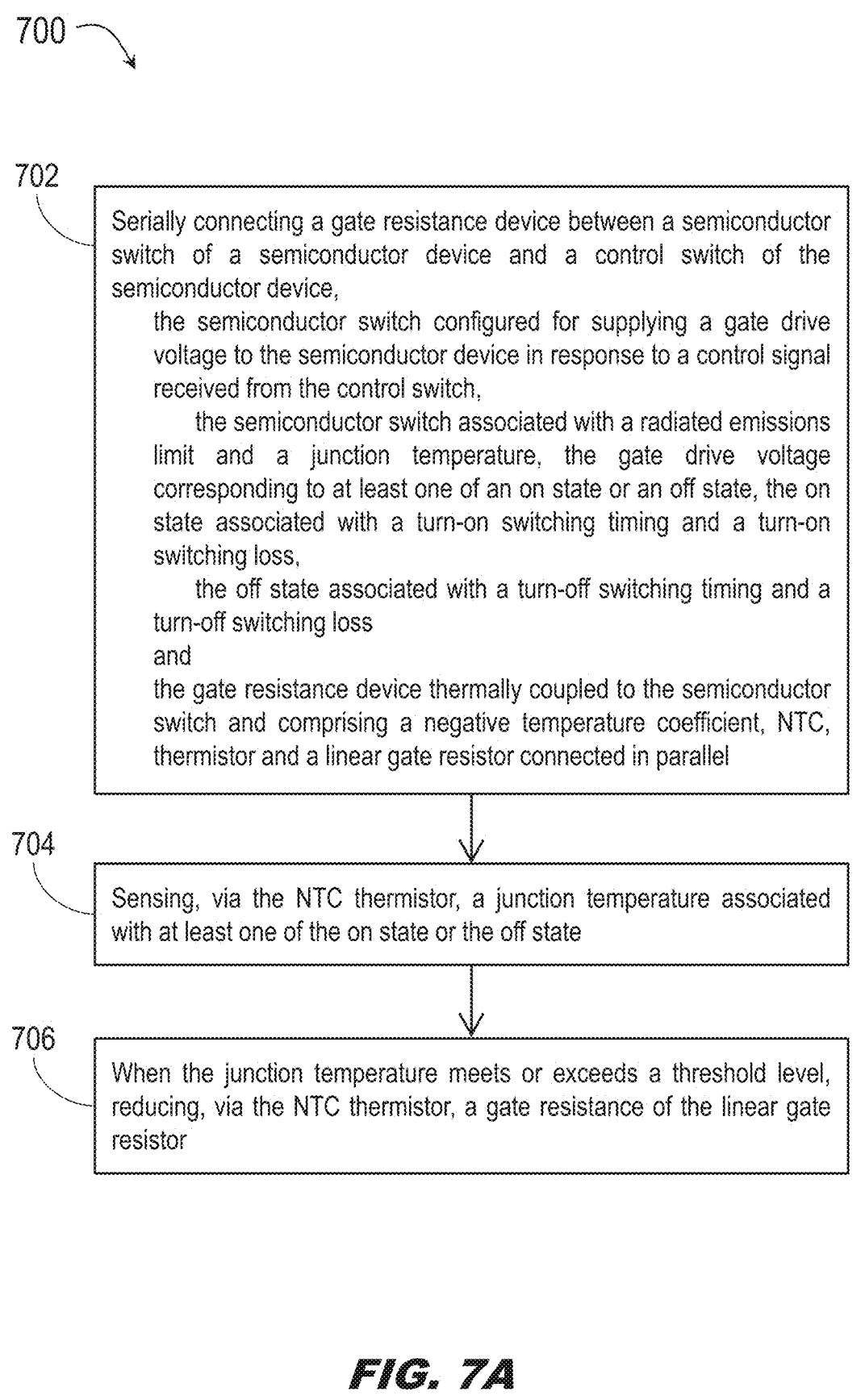

Serially connecting a gate resistance device between a semiconductor switch of a semiconductor device and a control switch of the semiconductor device, the semiconductor switch configured for supplying a gate drive voltage to the semiconductor device in response to a control signal received from the control switch, the semiconductor switch associated with a radiated emissions limit and a junction temperature, the gate drive voltage corresponding to at least one of an on state or an off state, the on state associated with a turn-on switching timing and a turn-on switching loss, the off state associated with a turn-off switching timing and a turn-off switching loss and the gate resistance device thermally coupled to the semiconductor switch and comprising a negative temperature coefficient, NTC, thermistor and a linear gate resistor connected in parallel

704

Sensing, via the NTC thermistor, a junction temperature associated with at least one of the on state or the off state

706

When the junction temperature meets or exceeds a threshold level, reducing, via the NTC thermistor, a gate resistance of the linear gate resistor

*FIG. 7A*

ADAPTIVE GATE DRIVER WITH NEGATIVE TEMPERATURE COEFFICIENT (NTC) RESISTOR

CROSS-REFERENCE TO RELATED APPLICATIONS

The present application claims the benefit under 35 U.S.C. § 119 (e) of Indian Provisional Patent Application No. 202311043329 filed Jun. 28, 2023. Said Indian Provisional Patent Application is herein incorporated by reference in the entirety.

TECHNICAL FIELD

The present disclosure is directed generally to the field of integrated circuitry and particularly to an adaptive gate drive circuit for a semiconductor switching device.

BACKGROUND

Power inverters for semiconductor devices may convert direct current (DC) into, e.g., three-phase alternating current (AC) and provide the alternating current as a gate drive voltage, switching rapidly between on (e.g., positive voltage) and off (e.g., non-positive voltage, or zero/negative voltage) states controlled by semiconductor switches (e.g., metal oxide semiconductor field effect transistor, MOSFET, or insulated gate bipolar transistor, IGBT). Gate resistors determine how rapidly the semiconductor switches between on and off states. Generally, the faster the switching, the lower the power loss associated with the switching. However, the faster the semiconductor switches switch, the greater the radiation emitted by the semiconductor switches. Comité International Spécial des Perturbations Radioélectriques (CISPR) or equivalent standards provide for maximum allowable radiation levels. Accordingly, gate resistors may be chosen to moderate power losses and enforce radiated emission limits. However, as more current flows through the semiconductor switches, junction temperatures will increase. If gate resistance increases, turn-on switching losses will increase linearly. However, if gate resistance is kept constant, switching delays and switching losses will both increase as junction temperatures rise.

SUMMARY

In a first aspect, an adaptive gate drive circuit for supplying power to a semiconductor device is disclosed. In embodiments, the adaptive gate drive circuit includes a semiconductor switch for supplying a gate drive voltage to the semiconductor device (e.g., based on a control signal from a control switch), the semiconductor switch having a radiated emissions limit and a junction temperature, both of which must be maintained at acceptable levels. The gate drive voltage may be positive (corresponding to an "on" state of the semiconductor switch, associated with turn-on switching timing delay and turn-on switching loss) or non-positive, i.e., zero or negative (corresponding to an "off" state of the semiconductor switch, associated with turn-off switching timing delay and turn-off switching loss). A gate resistance device is connected in series between the semiconductor switch and control switch, and thermally coupled to the semiconductor switch. The gate resistance device includes a negative temperature coefficient (NTC) resistor (e.g., thermistor) and linear gate resistor connected in parallel. The NTC thermistor senses the junction temperature of the semiconductor switch and, when the junction temperature meets or exceeds a threshold level, reduces the turn-on (or turn-off) switching timing or switching loss by reducing the gate resistance of the linear gate resistor, maintaining the junction temperature and/or radiated emissions limit within acceptable levels.

In some embodiments, the NTC thermistor reduces the gate resistance of the linear gate resistor until the junction temperature is reduced below the threshold level.

In some embodiments, the NTC thermistor reduces the gate resistance of the linear gate resistor based on an inverse linear relationship with an increase in sensed junction temperature.

In some embodiments, the NTC thermistor increases the gate resistance of the linear gate resistor based on a reduction in current load associated with the gate drive voltage.

In some embodiments, the NTC thermistor increases the gate resistance of the linear gate resistor based on a reduced sensed junction temperature.

In some embodiments, the linear gate resistor is associated with a minimum gate resistance based on a radiated emission limit of the semiconductor switch and a maximum gate resistance based on a power capacity of the semiconductor switch.

In some embodiments, the semiconductor switch is an insulated gate bipolar transistor, IGBT, or group thereof.

In some embodiments, the semiconductor device is a system on a chip, SoC, and one or both of the semiconductor switch and the gate resistance device are surface mounted devices, SMD.

In some embodiments, reducing the turn-on switching timing of the semiconductor switch (e.g., in the on state) includes reducing one or more of a turn-on switching delay, a rise time, or a charging time.

In some embodiments, reducing the turn-off switching delay of the semiconductor switch (e.g., in the off state) includes reducing one or more of a turn-off switching delay, a fall time, or a discharge.

In a further aspect, a method for optimal switching of a semiconductor device is disclosed. In embodiments, the method includes serially connecting a gate resistance device between a control switch and a semiconductor switch of a semiconductor device (and thermally coupling the gate resistance device to the semiconductor switch), the semiconductor switch providing a gate drive voltage to the semiconductor device in response to a control signal from the control switch. The semiconductor switch has both a radiated emissions limit and a junction temperature, both of which are to be maintained within acceptable levels (e.g., below threshold levels). The gate drive voltage corresponds to an on state (e.g., positive voltage) or an off state (e.g., non-positive voltage), the on-state associated with turn-on switching timing and switching loss and the off state associated with turn-off switching timing and switching loss. The gate resistance device includes a negative temperature coefficient (NTC) resistor (e.g., thermistor) and a linear gate resistor collected in parallel. The method includes sensing the junction temperature of the semiconductor switch via the NTC thermistor. The method includes, when the sensed junction temperature meets or exceeds a threshold level, reducing the gate resistance of the linear gate resistor via the NTC thermistor (e.g., in order to reduce the junction temperature).

In some embodiments, the method includes reducing the gate resistance of the linear gate resistor based on an inverse linear relationship with the increase in junction temperature.

In some embodiments, the method includes reducing the gate resistance of the linear gate resistor until the junction temperature is reduced below the threshold level.

In some embodiments, the method includes increasing the gate resistance based on a reduction in current load associated with the gate drive voltage.

In some embodiments, the method includes increasing the gate resistance based on reduced junction temperature.

In some embodiments, the linear gate resistor is associated with a minimum gate resistance based on a radiated emission limit of the semiconductor switch and a maximum gate resistance based on a power capacity of the semiconductor switch.

In some embodiments, the semiconductor switch is an insulated gate bipolar transistor, IGBT, or group thereof.

In some embodiments, the semiconductor device is a system on a chip, SoC, and one or both of the semiconductor switch and the gate resistance device are surface mounted devices, SMD.

In some embodiments, reducing the turn-on switching timing of the semiconductor switch (e.g., in the on state) includes reducing one or more of a turn-on switching delay, a rise time, or a charging time.

In some embodiments, reducing the turn-off switching delay of the semiconductor switch (e.g., in the off state) includes reducing one or more of a turn-off switching delay, a fall time, or a discharge.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The detailed description is described with reference to the accompanying figures. The use of the same reference numbers in different instances in the description and the figures may indicate similar or identical items. Various embodiments or examples ("examples") of the present disclosure are disclosed in the following detailed description and the accompanying drawings. The drawings are not necessarily to scale. In general, operations of disclosed processes may be performed in an arbitrary order, unless otherwise provided in the claims. In the drawings:

FIGS. 2A and 2B are graphical representations of increased switching losses as current and gate resistance increases through the conventional gate drive circuit of FIG. 1;

FIG. 3 is a tabular representation of increased switching losses and switching timings as junction temperature increases across semiconductor switches of the conventional gate drive circuit of FIG. 1;

and FIGS. 7A through 7C are process flow diagrams illustrating a method for optimal switching of a semiconductor device according to example embodiments of this disclosure.

DETAILED DESCRIPTION

Figure 1:
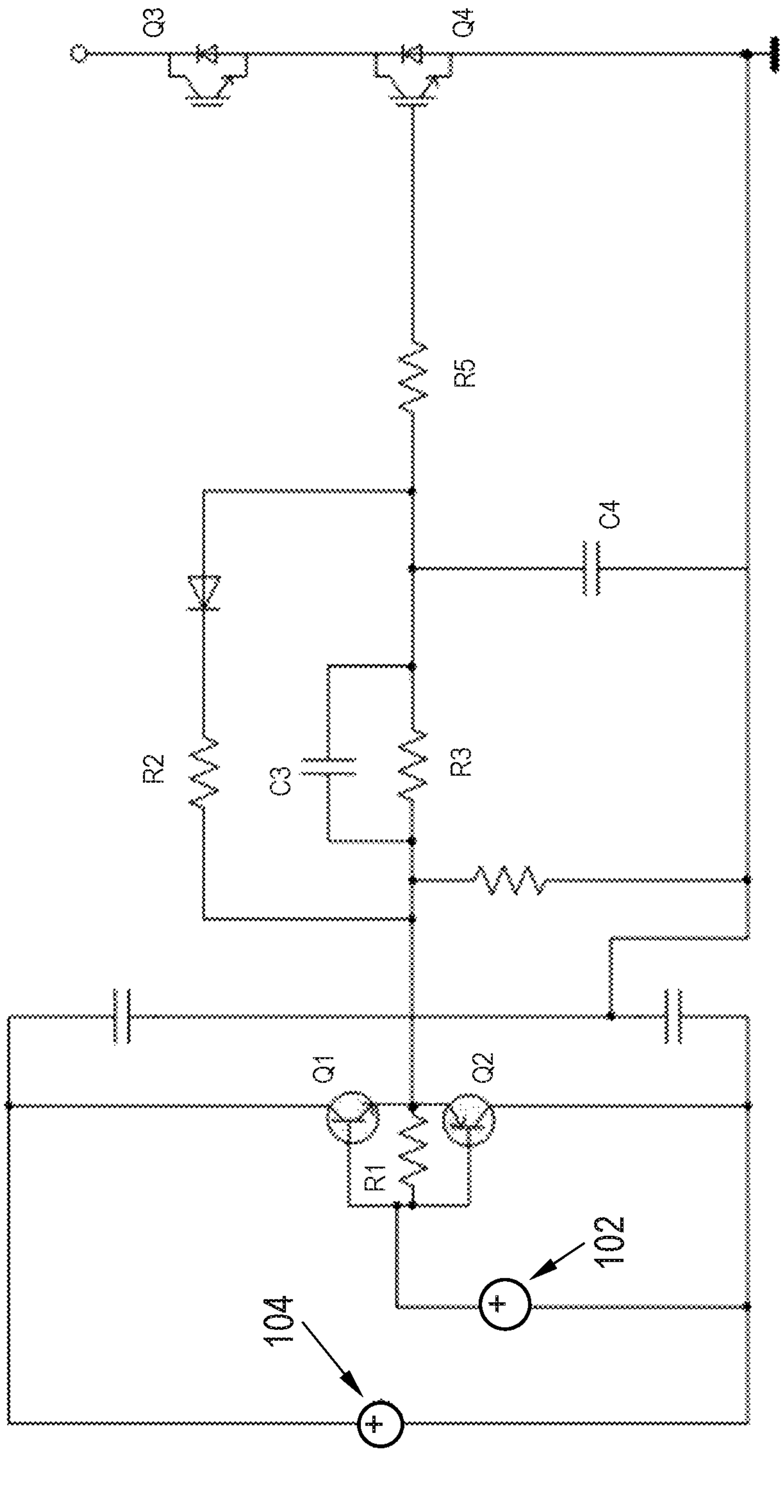
FIG. 1 is a block diagram of a conventional gate drive circuit for a semiconductor device.

Before explaining one or more embodiments of the disclosure in detail, it is to be understood that the embodiments are not limited in their application to the details of construction and the arrangement of the components or steps or methodologies set forth in the following description or illustrated in the drawings. In the following detailed description of embodiments, numerous specific details may be set forth in order to provide a more thorough understanding of the disclosure. However, it will be apparent to one of ordinary skill in the art having the benefit of the instant disclosure that the embodiments disclosed herein may be practiced without some of these specific details. In other instances, well-known features may not be described in detail to avoid unnecessarily complicating the instant disclosure.

As used herein a letter following a reference numeral is intended to reference an embodiment of the feature or element that may be similar, but not necessarily identical, to a previously described element or feature bearing the same reference numeral (e.g., 1, 1*a*, 1*b*). Such shorthand notations are used for purposes of convenience only and should not be construed to limit the disclosure in any way unless expressly stated to the contrary.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of "a" or "an" may be employed to describe elements and components of embodiments disclosed herein. This is done merely for convenience and "a" and "an" are intended to include "one" or "at least one," and the singular also includes the plural unless it is obvious that it is meant otherwise.

Finally, as used herein any reference to "one embodiment" or "some embodiments" means that a particular element, feature, structure, or characteristic described in connection with the embodiment is included in at least one embodiment disclosed herein. The appearances of the phrase "in some embodiments" in various places in the specification are not necessarily all referring to the same embodiment, and embodiments may include one or more of the features expressly described or inherently present herein, or any combination or sub-combination of two or more such features, along with any other features which may not necessarily be expressly described or inherently present in the instant disclosure.

Broadly speaking, embodiments of the inventive concepts disclosed herein are directed to a system and method for operating a semiconductor device at optimal efficiency via an adaptive gate drive circuit incorporating negative temperature coefficient (NTC) gate resistors ("thermistors"). For example, in conventional gate drive circuits an NTC gate resistor or thermistor (e.g., the resistance of which may decrease as temperature increases) may infer a junction temperature of a semiconductor switch (e.g., metal oxide semiconductor field effect transistors, MOSFET, insulated gate bridge transistors, IGBT, other like transistors or switching devices) based on a sensed temperature of a heatsink or base plate (which itself may be based on heat transferred from the semiconductor switch, and therefore may be associated with a finite delay). Circuit controllers may then lower voltage, current, and/or switching frequency in response to rising junction temperatures. However, adaptive gate drive circuits according to example embodiments of the inventive concepts disclosed herein may place NTC gate resistors closer to the actual junctions of the semiconductor switches, eliminating the need to regularly monitor heatsink temperature and the associated delay. The semiconductor switches are able to perform faster on/off switching while reducing switching losses and preserving radiated emissions limits at higher junction temperatures. The thermal time constant of the system may be increased, and intelligence transferred from microprocessor-based controllers to the gate drive circuit.

Referring now to FIG. 1, a conventional gate drive circuit 100 for a semiconductor device is shown. On/off control signals 102 (e.g., associated respectively with positive or non-positive (e.g., zero or negative) gate drive voltages 104 (e.g., $V_{CE}$=600 V, $V_{CE}$=±15 V) are amplified by the totem pole circuit of transistors Q1, Q2 and resistor R1. Transistors (e.g., semiconductor switches) Q3, Q4 form one arm of a three-phase half-bridge inverter and control on/off switching based on the control signals. In embodiments, transistors Q3 and Q4 are insulated gate bridge transistors, IGBT. Resistors R3, R5 and capacitors C3, C4 form a circuit for providing current when, Q4 is in a turn-on/ON state; additionally, when Q4 is in a turn-off/OFF state resistor R2 is connected in parallel with R3 (e.g., along with C4, R5). When turning on, Q4 can be switched slower or faster by varying the resistance of R3, R5 and the capacitance of C4.

In embodiments, turn-on and turn-off switching timings (e.g., for ON and OFF states respectively) each have three primary components. For example, turn-on switching timing may include a rise time $t_r$, a switching delay $t_{d(on)}$, and a charge time (e.g., for charging gate capacitors C3, C4). Similarly, turn-off switching timing may include a fall time $t_r$, a switching delay $t_{d(off)}$, and a discharge time (e.g., for discharging gate capacitance from C4). Ideally Q4 should switch on/off as rapidly as possible in order to reduce power losses associated with switching. With respect to Q4, power loss includes switching loss and conduction loss:

$$Pav = \frac{1}{T}\int_0^T P(t)dt =$$

$$F\left[\sum_{n_{on}} E_{on}\left(I_{n_{on}},\ V_{n_{on}}\right) + \sum_{n_{off}} E_{off}\left(I_{n_{off}},\ V_{n_{off}}\right) + \right] + \sum_{T_{cond_n}} \frac{1}{T} \int_{T_{cond_n}} P(t)dt$$

However, as Q4 is switched faster, emissions radiated by the semiconductor switches increase. As noted above, CISPR or equivalent standards provide for upper bounds on acceptable levels of radiated emissions. Accordingly, the selection of gate resistors R5 may be an engineering compromise to moderate power losses and preserve radiated emissions limits.

Referring to FIGS. 2A and 2B, switching loss characteristics of a typical half-bridge semiconductor switch (e.g., Q3, Q4 in FIG. 1) is shown. For example, as shown by FIG. 2A, turn-on switching losses $E_{on}$ and turn-off switching losses $E_{off}$ (in millijoules) are generally a function of current flowing through the semiconductor switch (e.g., collector current $I_C$, emitter current $I_E$) when the gate resistance $R_G$ of gate resistor R5 is kept constant, increasing uniformly as the junction temperature $T_j$ across the semiconductor switch Q3, Q4 rises from 125° C. to 150° C.

As shown by FIG. 2B, as gate resistance $R_G$ (e.g., internal or external) increases, turn-on switching losses $E_{on}$ increase linearly.

Referring also to FIG. 3, switching timing components of the typical half-bridge semiconductor switch (Q3, Q4; FIG. 2) are shown. For example, as collector current load $I_C$, gate drive voltage $V_{CE}$, $V_{GE}$, and gate resistance $R_G$ (on), $R_G$ (off) remain constant and junction temperature $T_j$ increases from a nominal 25° C. to 125° C. and 150° C., switching delays $t_{d(on)}$, $t_{d(off)}$ increase with temperature, as do rise and fall times $t_r$, $t_r$. Similarly, as noted above with respect to FIG. 2B, switching losses $E_{on}$, $E_{off}$ likewise increase with temperature.

As shown by FIG. 2B above, turn-on switching loss $E_{on}$ increases in roughly direct proportionality to an increase in gate resistance $R_{G(on)}$, which may cause junction temperatures $T_j$ to rise, which in turn may increase switching timing delays, slowing operations of the semiconductor device. Further, junction temperatures $T_j$ may rise sufficiently as to cause a failure in the gate drive circuit 100.

Figure 4:
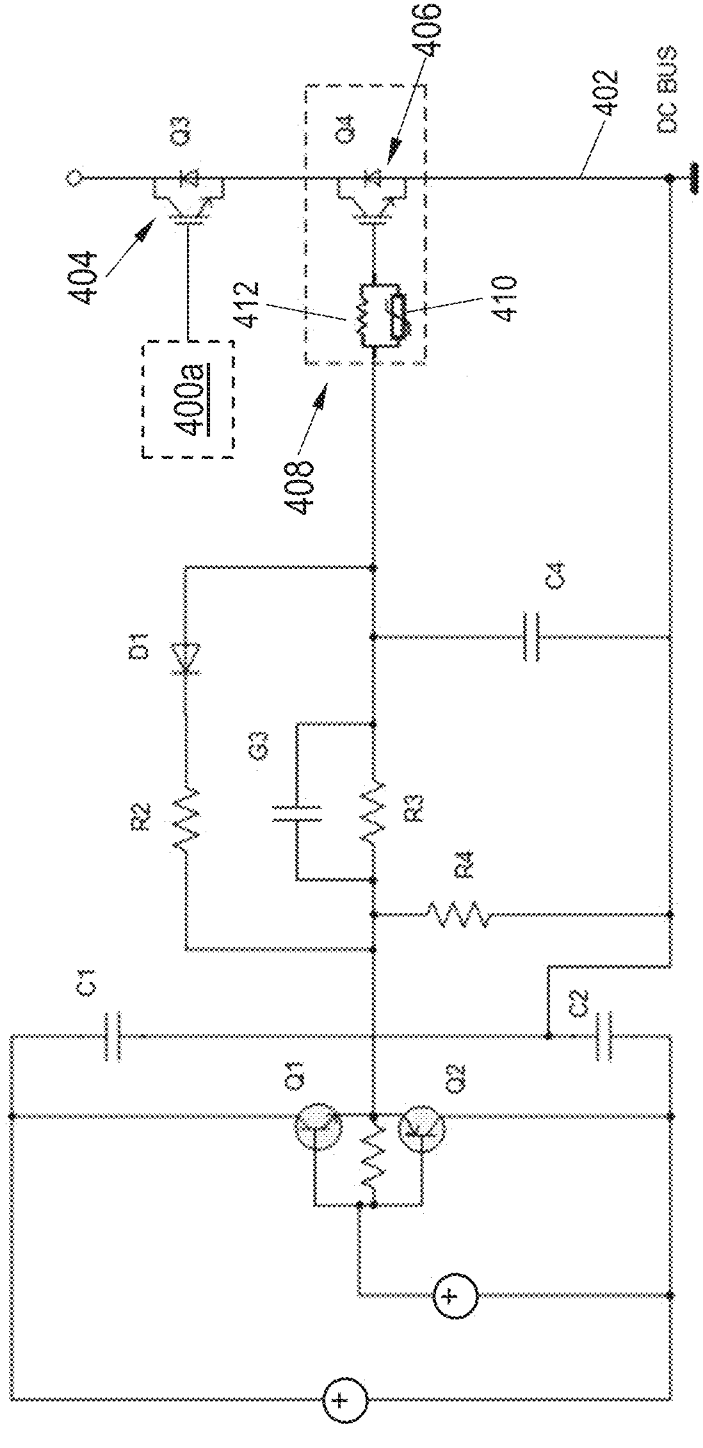
FIG. 4 is a block diagram illustrating a gate drive circuit incorporating a negative temperature coefficient (NTC) gate resistance device according to example embodiments of this disclosure.

Referring now to FIG. 4, the adaptive gate drive circuit 400 is shown. The adaptive gate drive circuit 400 may supply power to a connected semiconductor device (not shown) via a DC bus 402, controlled by semiconductor switches 404, 406 (e.g., IGBTs Q3 and Q4 respectively).

Broadly speaking, the adaptive gate drive circuit 400 allows the connected semiconductor switch Q4 (406) to operate more efficiently, and switch more rapidly, while moderating switching losses and maintaining both junction temperatures and radiated emissions at acceptable levels. In embodiments, the properties attributed to the Q4 IGBT 406 may similarly apply to the Q3 IGBT 404, which may have its own dedicated adaptive gate drive circuit 400*a* that may be implemented and may function similarly to the adaptive gate drive circuit 400 dedicated to the Q4 IGBT. For example, all references below to the adaptive gate drive circuit 400, to components thereof, and to the semiconductor switch 406 (e.g., IGBT Q4) may similarly apply to the adaptive gate drive circuit 400*a* and semiconductor switch 404 (e.g., IGBT Q3).

In embodiments, the adaptive gate drive circuit 400 may incorporate a gate resistance device 408 disposed proximate to the semiconductor switch 406. For example, the gate resistance device 408 may include a negative temperature coefficient, NTC, thermistor 410 configured to monitor the junction temperature of the semiconductor switch 406, the NTC thermistor connected in parallel with a linear gate resistor 412. In some embodiments, the gate resistance device 408 may be disposed proximate to the semiconductor device (not shown) to monitor a chip temperature thereof. In some embodiments, the semiconductor device and/or the adaptive gate drive circuit 400 are system-on-chip, SoC, devices or surface-mounted devices, SMD. For example, placing the gate resistance device 408 proximate to the semiconductor switch 406 and/or semiconductor device allows proper temperature coupling of the NTC thermistor 410 and allows the gate resistance device to adjust gate resistance in response to changes in junction temperature (e.g., chip temperature) with minimal delay.

In embodiments, the NTC thermistor 410 and gate resistor 412 are configured for adjustable resistance based on junction temperatures sensed by the NTC thermistor. For example, as current flowing through the semiconductor switch 406 increases (e.g., collector current $I_C$, emitter current $I_E$), increasing switching losses and therefore increasing junction temperature, the gate resistance device 408 may decrease gate resistance. The decreased gate resistance allows the semiconductor switch 406 to switch faster (e.g., reduced switching delay).

In embodiments, if current load through the semiconductor switch 406 is reduced, conduction losses may likewise decrease and the junction temperature may fall. Accordingly, the gate resistance device 408 may respond to the lower junction temperature by increasing gate resistance to operate the semiconductor switch 406 at normal switching loss levels. Broadly speaking, optimizing the semiconductor switch 406 and its cooling system allows the thermal time constant of the semiconductor switch and cooling system to significantly increase.

In embodiments, the gate resistance $R_{G(on)}$, $R_{G(off)}$ of the gate resistance device 408 may be adjusted between minimum and maximum resistance levels. For example, the minimum resistance may be determined by maximum acceptable radiated emissions levels at turn-on and turn-off. Similarly, maximum resistance levels may be determined based on the thermal or power capacity of the semiconductor switch 406 (e.g., and any available cooling systems or heatsinks).

Figure 5A:
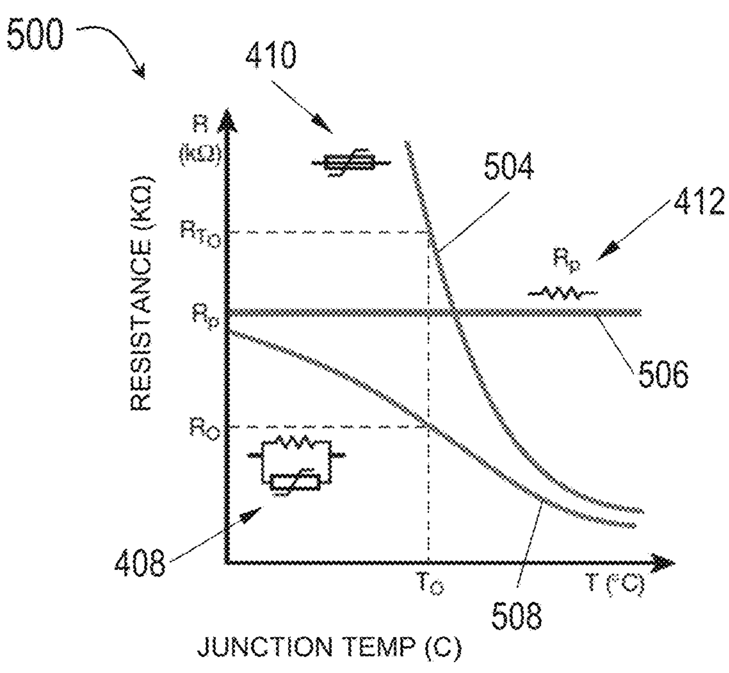
FIG. 5A is a graphical illustration of gate resistance of the individual components of the NTC gate resistance device of FIG. 4 as a function of temperature.
Figure 5B:
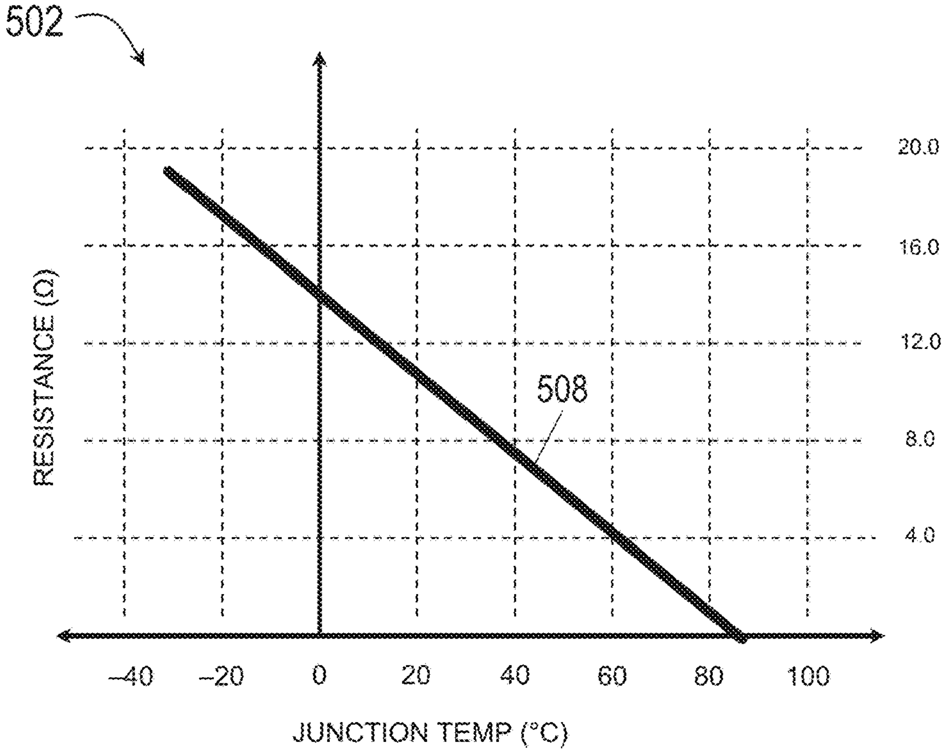
FIG. 5B is a graphical illustration of the collective gate resistance of the NTC gate resistance device of FIG. 4 as a function of temperature.

In embodiments, referring also to FIGS. 5A and 5B, the graphs 500, 502 illustrate resistance (R; kΩ (500), Ω (504)) of the individual components of the gate resistance device 408 of the adaptive gate drive circuit 400, 400$a$ (FIG. 4; e.g., the NTC thermistor 410, gate resistor 412) as a function of junction temperature (° C.), as opposed to the resistance of the composite gate resistance device (e.g., wherein the NTC thermistor and gate resistor are connected in parallel) as a whole.

In embodiments, the gate resistance device 408 may include the gate resistor 412 connected in parallel with the NTC thermistor 410 to ensure the gate resistance device is configured to reduce overall gate resistance in inverse linear proportion to an increase in junction temperature. For example, the resistance curve 504 of the NTC thermistor 410 as a function of junction temperature may be generally inverse, but non-linear, in nature. However, by connecting the NTC thermistor 410 in parallel with a gate resistor 412 having a linear resistance curve 506, the resistance curve 508 of the composite gate resistance device 408 may closely approximate an inverse linear relationship to junction temperature (as best shown by FIG. 5B).

Figure 6:
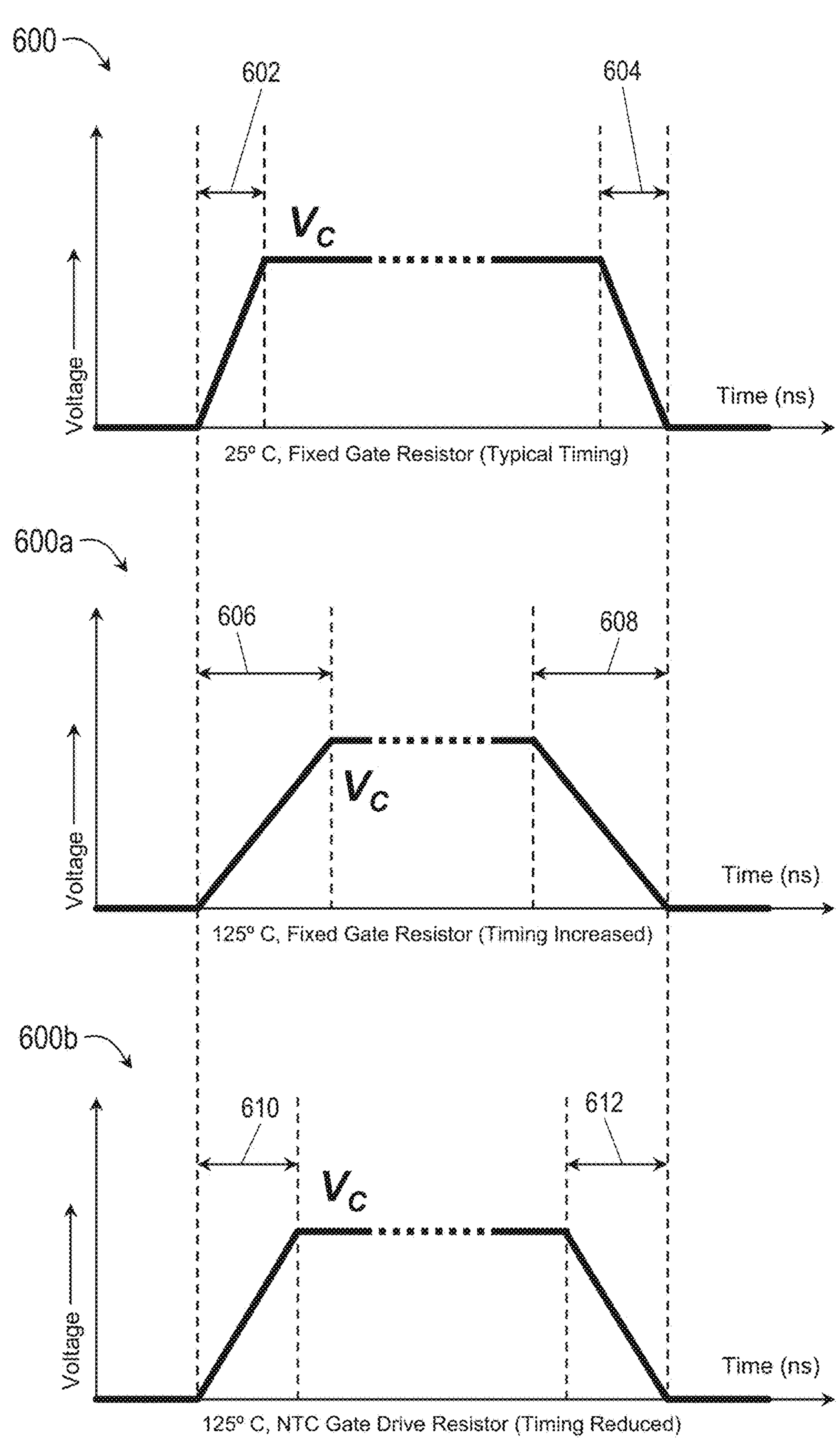
FIG. 6 is a graphical illustration of, respectively, turn-on and turn-off switching timings of the conventional gate drive circuit of FIG. 1 at a nominal junction temperature; turn-on and turn-off switching timings of the conventional gate drive circuit of FIG. 1 at an elevated junction temperature; and turn-on and turn-off switching timings of the gate drive circuit of FIG. 4 at the elevated junction temperature, according to example embodiments of this disclosure.

Referring now to FIG. 6, the graph 600 illustrates typical turn-on switching timings 602 and turn-off switching timings 604 for the conventional semiconductor switch, IGBT (Q4, FIG. 1). In embodiments, turn-on and turn-off switching timings 602, 604 at a nominal 25° C. junction temperature are represented in terms of the collector voltage, $V_C$, of the semiconductor switch 404, 406 as a function of time (e.g., in nanoseconds (ns)). As noted above, turn-on switching timings 602 include a rise time $t_r$, a switching delay $t_{d(on)}$, and a charge time (e.g., for charging internal/external gate capacitors). Similarly, turn-off switching timings 604 includes a fall time $t_r$, a switching delay $t_{d(off)}$, and a discharge time.

The graph 600$a$ illustrates typical turn-on and turn-off switching timings 606, 608 for the conventional semiconductor switch Q4 at an elevated junction temperature of 125° C. As noted above, longer turn-on and turn-off switching timings 606, 608 (due to one or more of, e.g., longer rise/fall times, longer switching delays, longer charge/discharge times) increase switching losses, which in turn increases junction and chip temperatures, which may in turn lead to thermal runaway conditions.

The graph 600$b$ illustrates turn-off and turn-on switching timings 610, 612 for the semiconductor switch Q3, Q4 (404, 406; FIG. 4) and adaptive gate drive circuit (400, 400$a$; FIG. 4) at the elevated junction temperature of 125° C. In embodiments, the incorporation of the gate resistance device 408 by the adaptive gate drive circuit 400, 400$a$ may reduce switching delays as well as charge/discharge times, reducing overall switching losses even at elevated junction temperatures while maintaining radiated emissions from the semiconductor switches 404. 406 within acceptable limits.

Referring now to FIG. 7A, the method of operation 700 may be implemented by the adaptive gate drive circuits 400, 400$a$ and may include the following steps.

At a step 702, a gate resistance device is serially connected between each semiconductor switch (e.g., an insulated gate bipolar transistor, IGBT) of a semiconductor device and the control switch of the semiconductor device. For example, each gate resistance device includes a negative temperature coefficient, NTC, thermistor (placed close to the IGBT junction) and a linear gate resistor connected in parallel. In embodiments, the semiconductor switch supplies a gate drive voltage to the semiconductor device (e.g., in response to a control signal received from the control switch). Further, the semiconductor switch is associated with a radiation emission limit (corresponding to a minimum gate resistance of the linear gate resistor), a junction temperature, and/or a power capacity (corresponding to a maximum gate resistance of the linear gate resistor). Further still, the gate drive voltage corresponds to one of an ON state (e.g., associated with a turn-on switching timing and a turn-on switching loss) or an OFF state (e.g., associated with a turn-off switching timing and a turn-on switching loss). For example, the turn-on switching timing may include a turn-on delay, a rise time, and/or a charging time associated with the ON state. Similarly, the turn-off switching timing includes a turn-off delay, a fall time, and/or a discharging time associated with the OFF state. In some embodiments, the semiconductor device is a system-on-a-chip (SoC), and one or more of the semiconductor switch or the gate resistance device is a surface mounted device.

At a step 704, the NTC thermistor senses the junction temperature associated with switching operations of the semiconductor switch (e.g., ON/OFF switching).

At a step 706, when the junction temperature meets or exceeds a threshold temperature, the NTC reduces the gate resistance of the linear resistor. In some embodiments, the NTC reduces gate resistance until the junction temperature falls back below the threshold level, allowing rapid ON/OFF switching by the semiconductor switch with minimal delay and/or minimal conduction loss. In some embodiments, the NTC thermistor reduces the gate resistance of the linear gate resistor based on an inverse linear relationship with an increase in a sensed junction temperature.

Figure 7B:
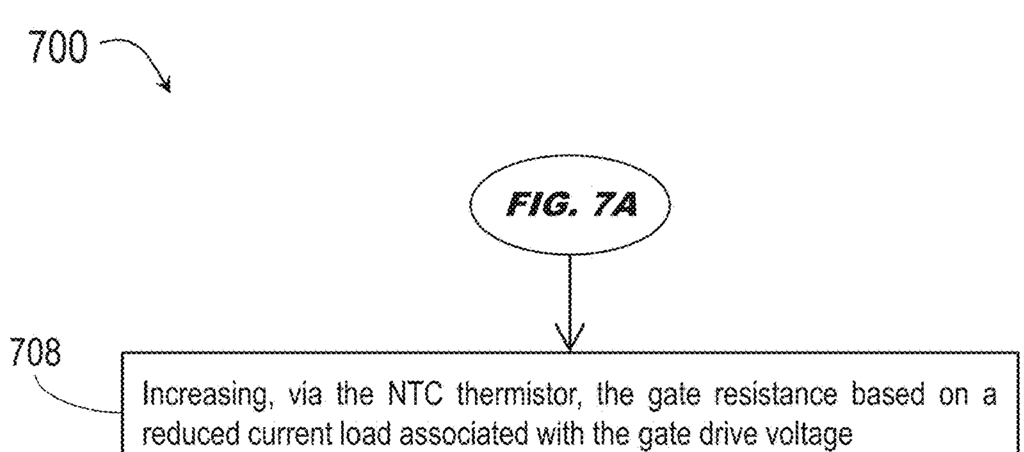

Referring also to FIG. 7B, the method 700 may include an additional step 708. At the step 708, the NTC thermistor responds to the fall in junction temperature by increasing the gate resistance of the linear gate resistor to allow the semiconductor switch to continue operating at normal switching loss levels.

Figure 7C:
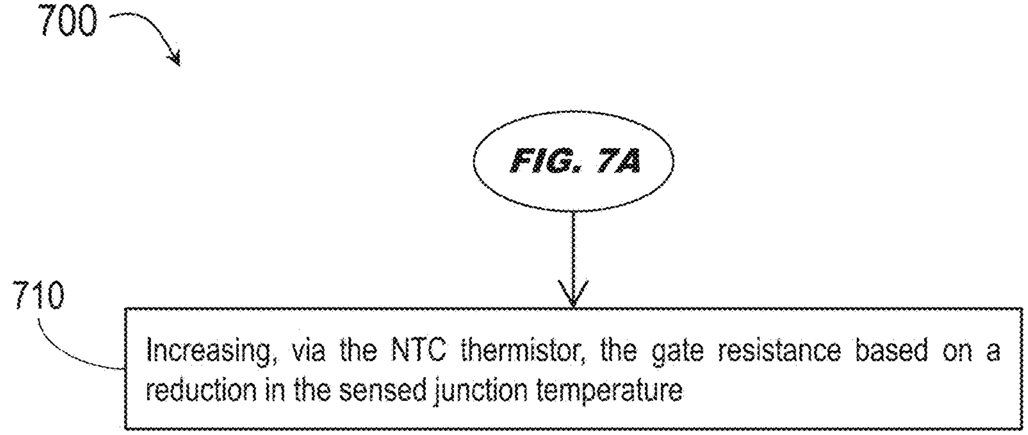

Referring also to FIG. 7C, the method 700 may include an additional step 710. At the step 710, the NTC thermistor responds to a reduction in the current load based on the gate drive voltage by increasing the gate resistance of the linear gate resistor.

CONCLUSION

It is contemplated that the system may have numerous advantages. For example, the system may provide the end user with the ability to customize the user interface, as well as a final view of the user interface incorporating the desired data, in near real time. Similarly, the system will significantly reduce cycle time in incorporating and finalizing end user requirements and desired features.

Those having skill in the art will recognize that the state of the art has progressed to the point where there is little distinction left between hardware and software implementations of aspects of systems; the use of hardware or software is generally (but not always, in that in certain contexts the choice between hardware and software can become significant) a design choice representing cost vs. efficiency tradeoffs. Those having skill in the art will appreciate that there are various vehicles by which processes and/or systems and/or other technologies described herein can be implemented (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be implemented, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations will typically employ optically-oriented hardware, software, and or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and/or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link, etc.).

In a general sense, those skilled in the art will recognize that the various aspects described herein which can be implemented, individually and/or collectively, by a wide range of hardware, software, firmware, or any combination thereof can be viewed as being composed of various types of "electrical circuitry." Consequently, as used herein "electrical circuitry" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of random access memory), and/or electrical circuitry forming a communications device (e.g., a modem, communications switch, or optical-electrical equipment). Those having skill in the art will recognize that the subject matter described herein may be implemented in an analog or digital fashion or some combination thereof.

Those having skill in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein. Furthermore, it is to be understood that the invention is defined by the appended claims.

I claim:

1. A gate drive circuit for a semiconductor device, comprising:
 - at least one semiconductor switch configured to supply a power to the semiconductor device in response to a control signal received from a control switch, the at least one semiconductor switch associated with:
   - a radiated emissions limit;
   - and
   - a junction temperature;
 - wherein a gate drive voltage associated with the power is one of:
   - a positive voltage corresponding to an on state, the on state associated with at least one of a turn-on switching timing or a turn-on switching loss;
   - or
   - a non-positive voltage corresponding to an off state, the off state associated with at least one of a turn-off switching timing or a turn-off switching loss;
 - and
 - a gate resistance device serially connected between the control switch and the at least one semiconductor switch, the gate resistance device thermally coupled to the at least one semiconductor switch, the gate resistance device comprising a negative temperature coefficient (NTC) thermistor and a gate resistor connected in parallel;
 - wherein the gate resistance device is configured to:
   - sense the junction temperature associated with at least one of the on state or the off state based on a relationship between the junction temperature and a resistance of the NTC thermistor;
   - and
   - in response to a change in the junction temperature, adjust one or more of the associated turn-on or turn-off switching timing or the associated turn-on or turn-off switching loss by adjusting a gate resistance of the gate resistor based on an inverse linear relationship between the junction temperature and a resistance of the gate resistance device.

2. The gate drive circuit of claim 1, wherein the gate resistance device is configured to reduce the gate resistance until the junction temperature is reduced below the threshold level.

3. The gate drive circuit of claim 1, wherein the gate resistance device is configured to increase the gate resistance based on a reduced current load associated with the gate drive voltage.

4. The gate drive circuit of claim 1, wherein the gate resistance device is configured to increase the gate resistance based on a reduction in the sensed junction temperature.

5. The gate drive circuit of claim 1, wherein the gate resistor is associated with:
 - a minimum gate resistance corresponding to the radiated emissions limit;
 - and
 - a maximum gate resistance based on a power capacity of the semiconductor switch.

6. The gate drive circuit of claim 1, wherein the at least one semiconductor switch includes at least one insulated gate bipolar transistor, IGBT.

7. The gate drive circuit of claim 1, wherein:
 - the semiconductor device is a system-on-a-chip, SoC;
 - and
 - the at least one semiconductor switch and the gate resistance device includes at least one surface-mounted device, SMD.

8. The gate drive circuit of claim 1, wherein the turn-on switching timing includes at least one of:
 - a turn-on delay associated with the on state;
 - a rise time associated with the on state;
 - or
 - a charging time associated with the on state.

9. The gate drive circuit of claim 1, wherein the turn-off switching timing includes at least one of:
 - a turn-off delay associated with the off state;
 - a fall time associated with the off state;
 - and
 - a discharging time associated with the off state.

10. A method for optimal switching of a semiconductor device, the method comprising:
 - serially connecting a gate resistance device between a semiconductor switch of the semiconductor device and a control switch of the semiconductor device,
   - the semiconductor switch configured for supplying a power to the semiconductor device in response to a control signal received from the control switch, the semiconductor switch associated with a radiated emissions limit and a junction temperature, a gate drive voltage associated with the power corresponding to at least one of an on state or an off state, the on state associated with a turn-on switching timing and a turn-on switching loss, the off state associated with a turn-off switching timing and a turn-off switching loss;
 - and the gate resistance device thermally coupled to the semiconductor switch and comprising a negative temperature coefficient (NTC) thermistor and a gate resistor connected in parallel;

sensing, via the NTC thermistor, the junction temperature associated with at least one of the on state or the off state based on a relationship between the junction temperature and a resistance of the NTC thermistor; and in response to a change in the junction temperature, adjusting one or more of the associated turn-on or turn-off switching timing or the associated turn-on or turn-off switching loss by adjusting a gate resistance of the gate resistor based on an inverse linear relationship between the junction temperature and a resistance of the gate resistance device.

11. The method of claim 10, wherein in response to a change in the junction temperature, adjusting a gate resistance of the gate resistor, includes:

when the junction temperature meets or exceeds a threshold level, reducing the gate resistance until the junction temperature is reduced below the threshold level.

12. The method of claim 10, further comprising:

increasing, via the gate resistance device, the gate resistance based on a reduced current load associated with the gate drive voltage.

13. The method of claim 10, further comprising:

increasing, via the gate resistance device, the gate resistance based on a reduction in the sensed junction temperature.

14. The method of claim 10, wherein the gate resistor is associated with:

a minimum gate resistance corresponding to the radiated emissions limit; and a maximum gate resistance based on a power capacity of the semiconductor switch.

15. The method of claim 10, wherein the semiconductor switch is an insulated gate bipolar transistor, IGBT.

16. The method of claim 10, wherein:

the semiconductor device is a system-on-a-chip, SoC; and the at least one semiconductor switch and the gate resistance device includes at least one surface-mounted device, SMD.

17. The method of claim 10, wherein the turn-on switching timing includes at least one of:

a turn-on delay associated with the on state;

a rise time associated with the on state; or a charging time associated with the on state.

18. The method of claim 10, wherein the turn-off switching timing includes at least one of:

a turn-off delay associated with the off state;

a fall time associated with the off state; or a discharging time associated with the off state.

* * * * *